US005173610A

United States Patent [19]

Lo

[11] Patent Number: 5,173,610

[45] Date of Patent: Dec. 22, 1992

[54] FORMING CHARGES IN LIQUID AND GENERATION OF CHARGED CLUSTERS

[75] Inventor: Shui-Yin Lo, Pasadena, Calif.

[73] Assignee: Apricot S.A., Luxembourg

[21] Appl. No.: 537,444

[22] Filed: Jun. 12, 1990

[51] Int. Cl.[5] .............................................. H01J 37/08

[52] U.S. Cl. ................................ 250/424; 250/423 R; 250/423 F

[58] Field of Search ............ 250/423 R, 423 F, 423 P, 250/288, 424; 315/111.81; 313/359.1

[56] References Cited

U.S. PATENT DOCUMENTS 4,559,096 12/1985 Friedman et al. ............. 219/121.11

4,755,344 7/1988 Friedman et al. .............. 250/423 R 4,902,572 2/1990 Horne et al. .......................... 437/38

4,940,893 7/1990 Lo ................................. 250/423 R

*Primary Examiner*—Bruce C. Anderson

*Attorney, Agent, or Firm*—Ladas & Parry

[57] ABSTRACT

Disclosed herein is a method of charging clusters comprising charging said clusters as they are formed by passing the fluid which will make up the clusters from an area of first pressure to an area of second pressure, the second pressure being lower than the first pressure, the charging of the clusters as they are formed being such that it does not destroy the strong coupling or coherency of the clusters.

9 Claims, 7 Drawing Sheets

FIG. 2
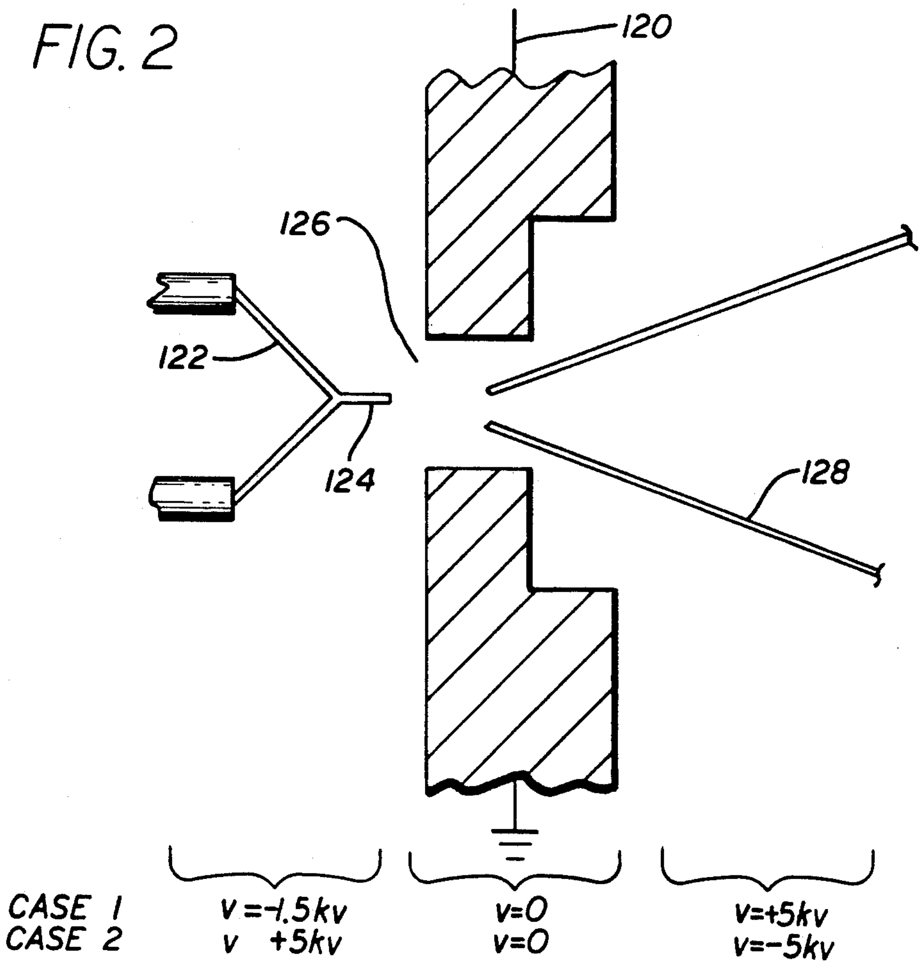
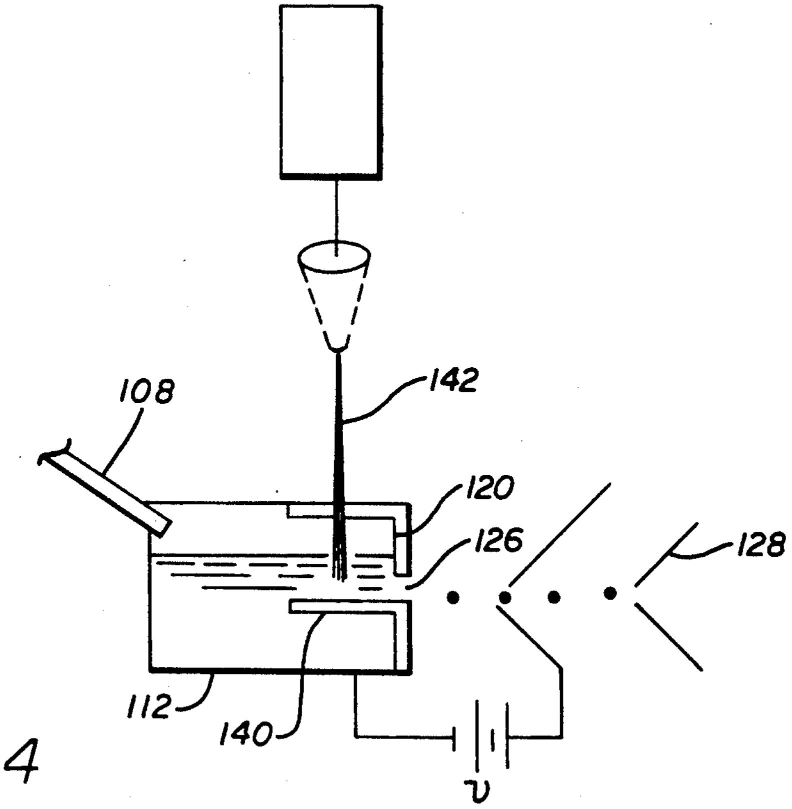
FIG. 4 a = 30 nm
b = 10 μm $\mu = 4.6 \times 10^{-5}$ $m^2/V\text{-}S$
$E_f = 5.5$ eV
W = 4.5 eV FIG 5
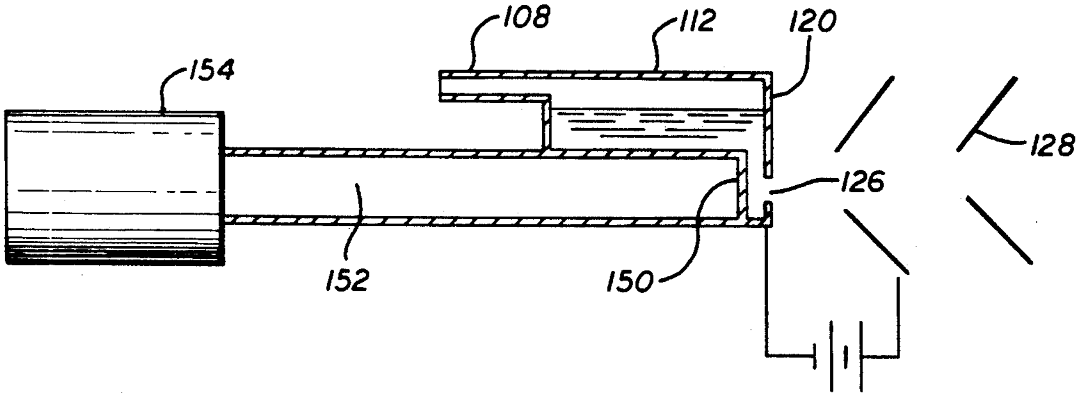
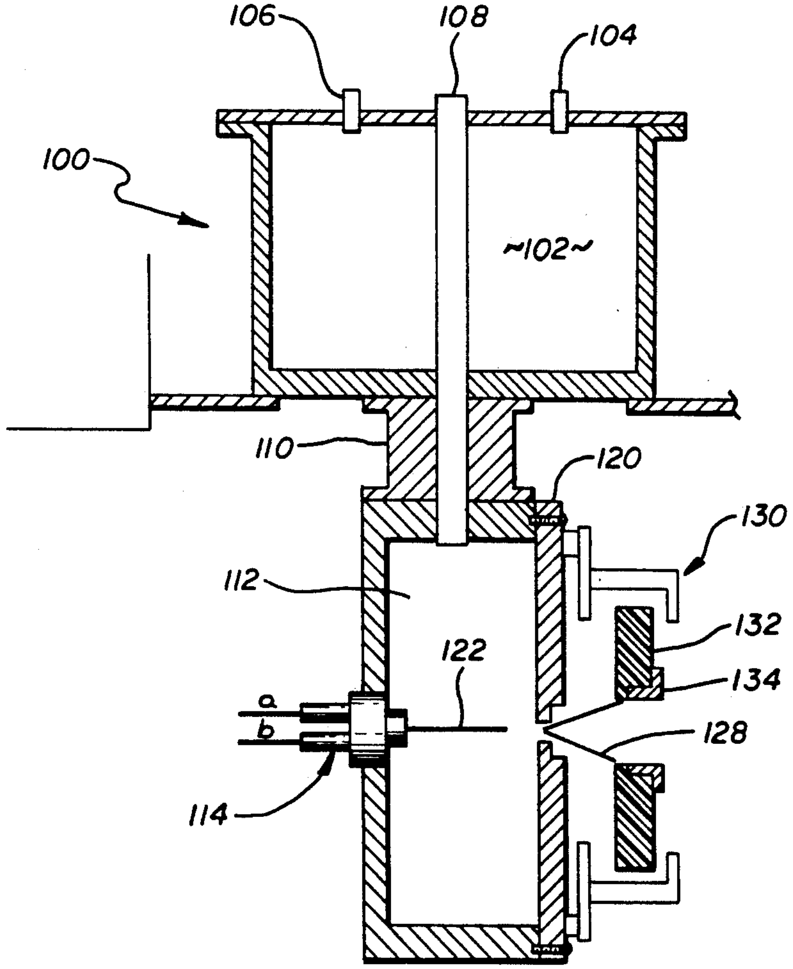
FIG 6

FORMING CHARGES IN LIQUID AND GENERATION OF CHARGED CLUSTERS

BACKGROUND OF THE INVENTION

The inventor teaches in USSN 169,648 and in USSN 112,842 methods for forming a coherent beam and a coherent cluster beam of bosons having mass. In these applications which are incorporated herein by reference, it is disclosed that these beams may be charged by exposing them to charged particles and, as such, accelerated by an applied voltage. Cluster formation from gas, superstaturated gas and superfluid helium, coherency of helium (helium being comprised of bosons having mass), and accelerating particles is well known in the art. The reader is referred to: U.S. Pat. No. 4,755,344, Friedman, Jul. 5, 1988; "Cluster-Impact Fusion" by P. M. Echenique, J. R. Mousin, R. H. Ritchie *Physical Review Letters,* Vol. 64, No. 12, 19 March 1990 pp. 1413–1416; "Clouds of trapped Cooled Ions Condense Into Crystals", Physics Today, Sept. 1988, pp. 17–20; "Cluster-Impact Fusion", R. J. Beuhler, J. Friedlander, and L. Friedman, *Physical Review Letters,* Vol. 63, No. 12, 18 September 1989 pp. 1292–1295; "Phase-Diagram Considerations of Cluster Formation When Using Nozzle-Beam Sources", E. L. Knuth, W. Li, J.P. Toennies, copyright 1989, American Institute of Aeronautics and Astronauts, Inc., International Symposium on Rarefied Gas Dynamics, p. 329, edited by M. Summerfield; "Cluster Ion Formation in Free Jet Expansion Processes at Low Temperatures", R. J. Beuhler and L. Friedman, copyright Verlog Chemie (mbH, D-6940 Weinheim, 1984) International Symposium on Rarefied Gas Dynamics; "Influence of Surface Roughness on the Momentum Transfer by 350-KeV Hydrogen-Cluster Ions"; W. Keller, R. Klingelhofer, B. Krevet, H. O. Moser, and R. Ries, *Rev. Sci. Instrum* 55(4), April 1984 pp. 468–471; "New Type of Collective Acceleration," Charles W. Hartman, James H. Hammer, *Physical Review Letters,* Vol. 48, No. 14, 5 April 1982 pp. 929–932; "Experimental Demonstration of Acceleration and Focusing of Magnetically Confined Plasma Rings", J. H. Haniver, Charles W. Hartman, Jr., L. Eddleman, *Physical Review Letters,* Vol. 61, No. 25, 19 December 1988, pp. 2843–2846, Japanese Patent 60-200448, Hitachi Seisakusho, K. K. Sep. 10, 1985; Conference Paper on "Rarefied Gas Dynamics", H. Buchenau, R. Gotting, A. Scheidemann, J. P. Toennies (1986) 15th International Symposium on Rarefied Gas Dynamics, Vol. II, p 197 (1986), edited by V. Boffi and L. Ceragnami; and "Dynamics of Atomic Collisions on Helium Clusters", Jurgen Gspann, R. Ries (Oct. 28, 1986) *Physics and Chemistry of Small Clusters* edited by P. Jenna, B. K. Rao and S. N. Khanna, Nato ASI Series 158, 1986, p. 199.

When considering the application of charged particles to clusters, the principal of field emission is now considered.

The principle of field emission is that for a curved surface with radius a of curvature r at a potential V, the electric field E may be defined as V/r so that for a small enough radius, say $r = 1\mu m$, and a potential of 1 kV, the electric field is $10^7$ V/cm, which is an enormous field. With this enormous field outside an atom, the electron can easily tunnel through the attractive potential and become free. This technique has been used in transmission electron microscopes to generate an electron source of very high brightness. In these devices, the cathode is made of a tungsten wire with a $1\mu m$ radius and then an extra fine tip with a radius of 100 nm or less is electrolytically etched on the fine wire. For a brief description of this technology, see e.g. L. Reiner: *Transmission Electron Microscope, 2nd Edition,* Springer Valley (1989); paper on "Rarefied Gas Dynamics", H. Buchenau, R. Gotting, A. Scheidemann, J. P. Toennies (1986), 15th International Symposium on Rarefied Gas Dynamics, Vol. II, P. 197 (1986) edited by V. Boffi and L. Ceragnami; "Dynamics of Atomic Collisions on Helium Clusters", Jurgen Gspann, R. Ries (Oct. 28, 1986), Physics and Chemistry of Small Clusters, edited by P. Jenna, B. K. Rao and S. N. Khanna, Nato ASI Series 158, 1986, page 199. The characteristics of the electron source are

| | |
|---|---|
| field strength | $10^7$ V/cm |
| area | $10^{-12}$ m$^2$ |
| current density | 100 A/cm$^2$ |
| current | 1 ~ 10 μA |
| solid angle | 0.1 radian |

Until now, field emission technique has been used to generate electrons. Now disclosed is the use of the field emission technique to generate electrons in liquids as well as gases, that is in fluids, to charge strongly coupled or coherent clusters.

SUMMARY OF THE INVENTION

Disclosed herein is a method for forming strongly coupled or coherent charged clusters comprising:

passing a fluid comprised of liquid or gas, into a nozzle defining a nozzle mouth, said nozzle maintaining the liquid at a first pressure;

introducing one of negatively or positively charged particles in the liquid by means of the respective one of field emission or ionization;

directing the charged liquid out of said nozzle mouth into a second area of lesser pressure than the first area such that a beam of charged clusters is created.

In the embodiments the means for introducing the charged particles is through a tip made from tungsten wire, a latham compound ($LaB_6$), or other element with a low work function. Particularly of interest in this invention is the charging of a liquid as it is turned into clusters and doing so without destroying the strong coupling or coherency of that cluster. It is preferable that these charges be introduced close to nozzle mouth.

DESCRIPTION OF THE DRAWINGS

FIG. 2 is a diagrammatic depiction of the tungsten tip, nozzle mouth, and skimmers of FIG. 1.

FIG. 4 is a diagrammatic view of a second embodiment of the nozzle portion of the invention, the tungsten wire being replaced by a photoelectric device.

FIG. 5 is a diagrammatic view of a third embodiment of the nozzle portion of the invention, tungsten foil and an electron gun replacing the tungsten wire.

FIG. 6 is a view similar to that of FIG. 1, a tungsten wire being shown immersed in liquid.

DETAILED DESCRIPTION OF THE INVENTION

Theoretical Background

Figure 1:
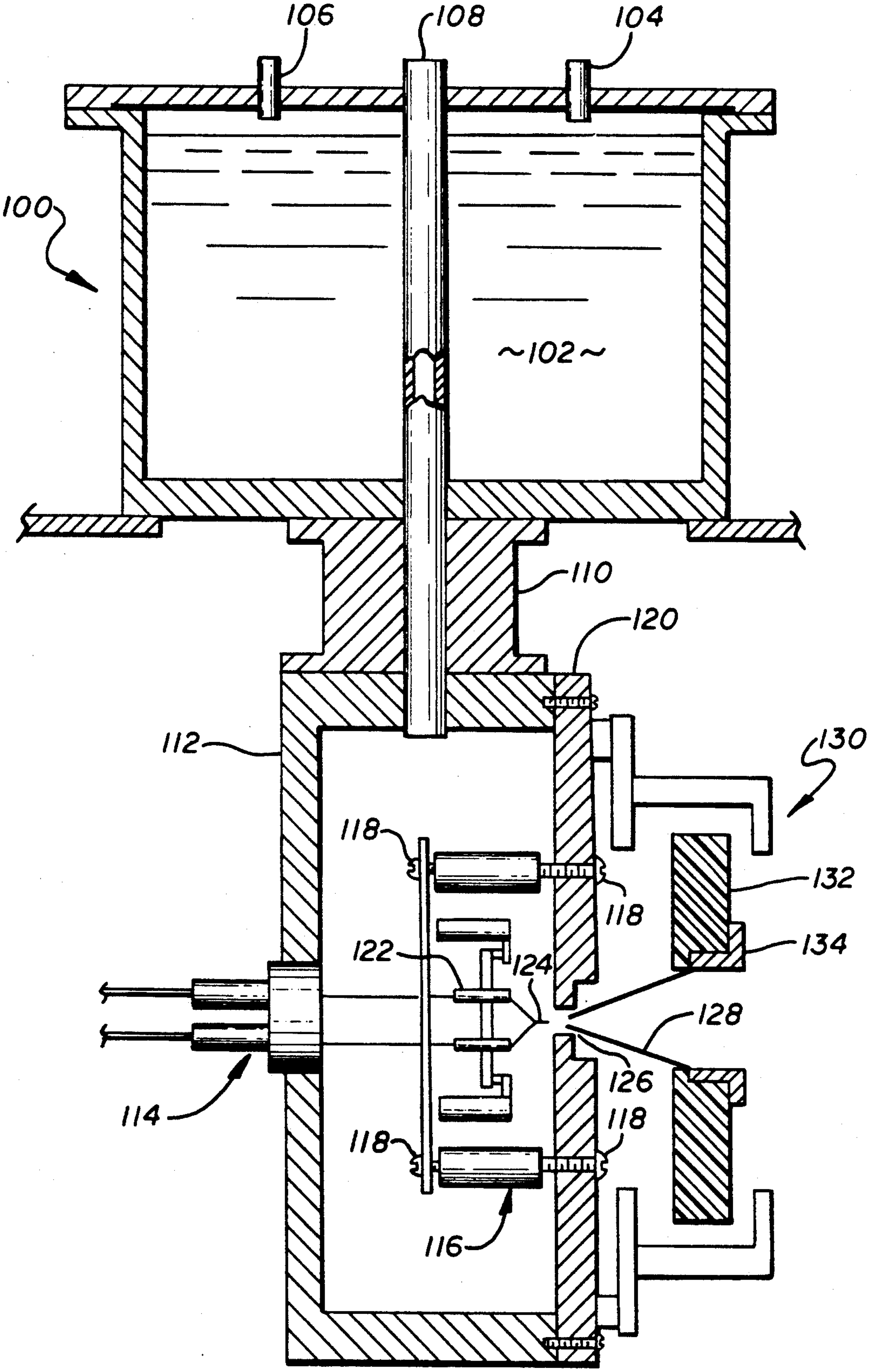
FIG. 1 is a sectional view of a cryostat and nozzle for creating charged coherent or strongly coupled particles preferably in cluster form.

To assist the reader in better understanding this invention, a theoretical description of the technology involved is first presented.

1. Beam of Strongly Coupled or Coherent Clusters

There are two kinds of beams made up of coherent clusters which are charged. For neutral coherent clusters, there does not exist any interaction between any two clusters. However, if the clusters are charged, then the clusters interact via Coulomb forces. In such a beam, the coupling of the clusters can be separated into weakly coupled clusters and strongly coupled clusters by their coupling factor (Γ) defined as $$\Gamma = \frac{P.E.}{K.E.} = \frac{(Ze)^2}{aT} \quad (1)$$

where a=average distance between the clusters

Z=charge of the clusters

T=temperature of the cluster beam e=electron charge

The charged cluster beam then can behave as $\Gamma < 1$ gas-like $\Gamma \sim 1$ liquid-like $\Gamma > 1$ superfluid or solid (2)

In Table I, the coupling for clusters with some charges, Z are listed

TABLE 1

The Coupling of Charged Cluster Beam

| Temperature | Density n (1/cm) | Distance a | Coupling (Γ) Z = 1 | Z = 2 | Z = 3 | Z = 10 |
|---|---|---|---|---|---|---|
| T = 1.2° K. | $10^{18}$ | 6 nm | 2335 | 9420 | 21195 | $2.355 \times 10^5$ |
| | $10^{15}$ | 60 nm | 233.5 | 942 | 2119.5 | 23550 |
| | $10^{12}$ | 0.6 μm | 23.35 | 94.2 | 211.95 | 2355 |
| | $10^{9}$ | 0.6 μm | 2.335 | 9.42 | 21.195 | 235.5 |
| | $10^{8}$ | 13.35 m | 1.093 | 4.36 | 9.84 | 109.3 |
| | $10^{7}$ | 28.78 m | 0.507 | 2.03 | 4.56 | 50.7 |
| | $10^{6}$ | 62 μm | 0.236 | 0.94 | 2.12 | 23.55 |
| T = 0.4° K. | $10^{18}$ | | 7,065 | 28,260 | 63,585 | 706,500 |
| | $10^{15}$ | | 706 | 2,826 | 6,358.5 | 70,650 |
| | $10^{12}$ | | 70.65 | 282.6 | 635.85 | 7065.0 |
| | $10^{9}$ | | 7.065 | 28.26 | 63.59 | 706.5 |
| | $10^{8}$ | | 3.28 | 13.08 | 29.52 | 328 |
| | $10^{7}$ | | 1.52 | 6.08 | 13.68 | 152 |
| | $10^{6}$ | | 0.707 | 2.82 | 6.36 | 70.7 |

The average distance "a" between clusters is defined by $$\frac{4}{3}\pi a^3 n = 1$$

From Table 1, it is seen that for singly charged clusters with Z=1, at 0.4 degrees kelvin, density $n \sim 10^6$ to $10^9$, the coupling factor (Γ) ranges from 1 to 7 so that the charged cluster beam is liquid-like. To have a crystalline cluster beam, it is convenient to have multiple charged clusters, say with $Z \cong 10$ for each cluster.

There are three binding energies that are important in considering the stability of strongly coupled cluster beams:

(1) the binding energy of electrons or ions to the atom (or molecule), (2) the binding energy of one atom (molecule) with another atom (molecule) in the cluster, and (3) the potential energy among the charged clusters.

If these three energies are stronger than the perterbing source, such as from the external accelerating electric potential, or from the Coulomb repulsion among charges inside the cluster beam, then the cluster beam will preserve its character. Otherwise, the cluster beam will undergo some qualitative changes. Let us discuss these binding energies and Coulomb repulsion forces one at a time.

2. Binding Energies (i) The binding energy (B) of electrons and ions with atoms (or molecules).

The binding energy of electrons to H or $H_2$ to form $H^-$ and $H_2^-$ is 0.75eV which is about 20 times smaller than the binding energy of electrons in a neutral hydrogen molecule.

$$B_{e-}(H^-)=0.7542\text{eV} \quad (3)$$

(ii) The binding energy of an atom (molecule) in a cluster.

Here, the binding energy can be estimated from the heat of vaporization. The heat of vaporization for liquid oxygen is 6812.3 J/mole. By molecule, the binding energy (B) is $$B_{O_2} = \frac{6812.3 \text{ J}}{6 \times 10^{23}} = 0.071 \text{ eV} \quad (4)$$

where $O_2$ is oxygen and $6 \times 10^{23}$ is Avogadro's number.

This binding energy is ten times smaller than the binding energy of electrons to the hydrogen atom. For helium, the heat of vaporization is about 14 to 22 cal/mole depending on pressure, and the binding energy of the helium atom in liquid is in the range of $$B_{He}=(6.1 \text{ to } 9.6)\times 10^{-4} \text{ eV}$$

The potential energy between two neighboring charged clusters inside a cluster beam is $$eV_c = z^2 \frac{e^2}{a} \tag{5}$$

$$= 1.46 \times 10^{-3} \text{ eV for } z = 1,\ a = 1\ \mu\text{m}$$

where again V is the potential, Z is the cluster charge, and a is the average distance between clusters Hence the potential energy between two neighboring charged clusters is smaller than the binding energy of the cluster (except in the case of helium clusters). We then have the following inequality.

$$B_e >> B_{cl} > V_c \tag{6}$$

The condition for accelerating a crystalline solid strongly coupled cluster without destroying the crystalline structure is $$\frac{eV}{1} < \frac{eV_c}{a} \tag{7}$$

where eV = the potential difference between two electrodes

1 = distance between two electrodes $eV < eV_c$ so for $$eV_c = 1.46 \times 10^{-3} \text{ volt},\ a = 1\ \mu\text{m},\ l = 1 \text{ cm},$$

$$eV < 14.6 \text{ volt} \quad \text{for } z = 1$$

$$eV < 1.46 \text{ kV} \quad \text{for } z = 10$$

There are two important features for accelerating a crystalline charged cluster beam that separate it from those of an ordinary ion beam.

(1) All sizes of clusters are accelerated at the same speed. Hence, the total beam intensity is greatly enhanced. The size of a cluster in a cluster beam may range from A=100 to A=5,000 atoms or more in any single cluster. The charges in each cluster may vary from Z=1 to Z=10 or more. If we select clusters with a fixed number of atoms, say 200 atoms, and fixed charge, say Z=1, we only have a very small portion of all clusters in a cluster beam. However, if the clusters are not strongly coupled, we can only accelerate clusters with the same A and Z, with a given potential. Clusters with different A's and Z's will travel at different speeds. The resulting cluster beam from acceleration through an applied electric field is a very weak beam for a weakly coupled cluster beam.

(2) The energy spread ΔE of the accelerated crystalline cluster beam is very small. It is only equal to the temperature T of the cluster.

$$\Delta E \sim T$$

Since $T \sim 10^{-4}$eV for a helium cluster which was cooled to this temperature during expansion, the energy spread as a percentage of the final energy E of the cluster beam is extraordinarily small, $$\frac{\Delta E}{E} = \frac{T}{E} = 10^{-7} \quad \text{for } E = 1 \text{ keV}.$$

A very high quality beam is produced. It is clear that production of a charged crystalline solid strongly coupled cluster is advantageous. The inventor's earlier noted applications, all incorporated herein by reference, disclose the means for forming coherent clusters. These are clusters that are coherent within themselves and amongst themselves. As discussed above, adding charge to these clusters is tremendously advantageous and now disclosed is the detailed method of accomplishing this task. This method does not destroy the coherency of the clusters nor does it unduly heat the fluid from which the clusters are made. This is not true when electric arcing, (such as in the above-noted Friedman patent), microwaves or heating gas is used.

3. Method of Generating Charged Particles to Produce Strongly Coupled Clusters

The inventor teaches in the above-noted patent applications, incorporated herein by reference, the method of making coherent clusters. These are created by passing bosons with mass (such as helium) through a nozzle of a higher pressure to an area of lower pressure (such as a vacuum). In this method, it is advantageous to have a high density of bosons and to keep the temperatures at room temperature or below. The forming of coherent helium and helium clusters is well-known in the art. The known method of producing clusters is modified in this invention by charging the bosons with mass just before they exit the nozzle mouth into the area of lower pressure. Presenting the charge at this point and presenting it in a slow, low energy manner, prevents the heating of the bosons with mass, thus, preventing the undue heating of the fluid. It also prevents or minimizes the destruction of any strongly coupled or coherent particles or clusters. Also clearly taught herein is forming clusters from a liquid as well as a gas.

FIG. 1 shows a first embodiment of the invention. Cryostat (100) defines within itself a reservoir (102) in which liquid nitrogen is held. Instead of liquid nitrogen, other elements for cryogenic cooling may be used. Some of these are liquid helium, liquid hydrogen, etc. At the top of cryostat (100) is inlet pipe (104) through which the liquid nitrogen is introduced into reservoir (102), and outlet/pumping connection (106) which communicates with reservoir (102). Also shown is tube (108) which passes through cryostat (100) and reservoir (102). It is through tube (108) that the fluid which is to be charged in the nozzle is fed. This fluid is usually in the form of a gas and preferably a purified gas, when introduced near the top of cryostat (100) into tube (108). However, as the gas passes down tube (108) and thus through reservoir (102), it is cooled by the liquid nitrogen surrounding tube (108) and becomes a liquid. The liquid contemplated herein is comprised of bosons having mass such as water, hydrogen, nitrogen, deuterium, helium, etc. Cryostat (100) is connected through attachment means (110) to nozzle cell (112) which forms a portion of the nozzle used to spray the liquid into the lower pressure area. Tube (108) passes through cryostat (100), attachment means (110), and into the cavity defined by nozzle cell (112). Here the gas turned liquid which is passed through tube (108), empties. The back of nozzle cell (112) attaches to a plug (114) whose electrical wires are diagrammatically depicted as "a" and "b". At one end outside of nozzle cell (112), wires "a" and "b" are attached to a voltage device which is not shown. At another end, wires (a,b) pass through plug (114) and are electrically connected to tungsten wire (122) held in adjustable mounting (116). Screws (118) or other adjustment means are shown in adjustable mounting (116) and attach adjustable mounting (116) to nozzle face (120). Adjustment of screws (118) enables the displacement of adjustable mounting (116), tungsten wire (122) and its tip (124) with respect to the back of nozzle cell (112) and nozzle face (120). As can be seen in FIG. 1, nozzle face (120) connects to nozzle cell (112) opposite of the back of nozzle cell (112). Some details concerning tungsten wire (122) and its tip (124) are discussed herein in the Background of Invention section and the reader may wish to review this section. Tip (124) lies preferably behind and centrally of nozzle mouth (126) defined in nozzle face (120). The distance between tip (124) and nozzle mouth (126), and the size of tip (124) are significant in terms of the results obtained and are discussed further herein.

The diameter of nozzle mouth (126) should be in the range of approximately 5 microns to 1 millimeter. Located near nozzle mouth (126) and emanating therefrom are skimmers (128) attached to variable position mount (130). Variable position mount (130) is adjustably connected to nozzle face (120) to enable movement of skimmers (128) toward or away from nozzle mouth (126). While skimmers (128) are indirectly connected to nozzle face (120), they are insulated therefrom so that the voltage between skimmers (128) and nozzle mouth (126) can be varied. The manner of achieving such insulation is evident to one skilled in the art. In FIG. 1, insulated elements (132) are shown as part of variable position mount (130), and conductive elements (134) also part of variable position mount (130), connect to voltage means (not shown) for charging skimmers (128). While electrical connections to skimmers (128) and nozzle mouth (126) are not shown, the manner of attending to such is known in the art and is contemplated herein to achieve the voltage variation discussed. Similarly, while tip (124) is indirectly connected to nozzle face (120) by adjustable mount (116), it is insulated therefrom so that again a voltage difference between tip (124) and nozzle mouth (126) is possible.

It is to be understood that the pressure in nozzle cell (112) is at one level while the pressure around skimmers (126) is at another level. In the present example, skimmers (126) are located in a vaccuum chamber while the pressure inside nozzle cell (112) is at a higher level. This enables the formation of clusters in the manner known in the art.

With the apparatus of FIG. 1, the fluid introduced through tube (108) into nozzle cell (112) will exit nozzle mouth (124) into an area of lower pressure such as a vacuum chamber. Prior to exiting, however, the gas turned liquid will be charged by a very low voltage emitted from tip (124) of tungsten wire (122). Tip (124) is then at one voltage level, nozzle mouth (126) is at another voltage level, and skimmers (128) are at a voltage level different from that of nozzle mouth (126). Review of FIG. 2, is of use in this instance.

In FIG. 2, tip (124) emits a charge of negative 1.5 kilovolts. Nozzle mouth (126) is at ground and skimmers (128) are at positive 5 kilovolts. Alternatively, tip (124) could be at positive 5 kilovolts, nozzle mouth (126) at ground, and skimmers (128) at negative 5 kilovolts.

Once the liquid near tip (124) in nozzle cell (112) is charged by electrons slowly emitted from tip (124), the charged liquid is attracted and accelerated toward and through the positively biased nozzle mouth (126). Some of the electrons may also combine with the molecules in the liquid to form negative ions such as $N_2$. The liquid with electrons passes through nozzle mouth (126) and enters the vacuum chamber where skimmers (128) are located. The liquid will fragment into clusters due to the low pressure in the vacuum chamber as well as due to the coulomb repulsion among the electrons. The clusters then consist mostly of neutral atoms or molecules and are negatively charged due to the extra electrons in them. If the voltage in tip (124) is reversed so that it is positive, say 5 kilovolts voltage with respect to nozzle mouth (126), then the strong positive field near the surface of tip (124), will ionize the atoms or molecules in the liquid. Electrons will flow into the tungsten wire (122) and positive ions such as ions $H^+$, $N^+$, $+d^+$, or $He^+$, (if the liquid is composed of hydrogen, nitrogen, deuterium, or helium), will travel toward the relatively negatively biased nozzle mouth (126). The liquid containing these positively charged ions flows into the vacuum chamber and fragments into positively charged clusters.

Tip (124) is preferably placed within nozzle cell (112) and within the liquid to be formed into clusters. It is also preferably placed near nozzle mouth (126).

If a field emission method is used to inject electrons or ions in liquid, due to the small mobility of charged particles in liquid, they tend to travel slowly. In fact, the velocity (u) is $$\vec{u}=\mu\vec{E} \tag{9}$$

where $\mu$ is the mobility and E the electric field at that point. For a spherical symmetric configuration where tip (124) is at the center with applied potential V, the electric field due to the applied external potential without counting the contribution from charges in the liquid drops off as $1/r^2$ where r is the distance from the center. So, if the charged ions in the liquid are under the influence of an external electric field alone, they will travel at a slower speed as they move further from tip (124). This is quite different from the case in a vacuum. However, since charges are continuously being emitted from tip (124), coulomb repulsion forces will push the charged ions causing them to move faster away from tip (124). The three equations that govern the behavior of charged particles in liquid are the continuity equation, the Poisson equation, and the Lorentz force equation:

$$\nabla\cdot(\vec{nu})=0 \tag{10}$$

$$\nabla^2\phi=4\pi en \tag{11}$$

$$e(-\nabla\phi)=\mu u \tag{12}$$

where n = charge density
$\phi$ = electric potential
$\nabla$ = gradient
u = velocity
$\mu$ = mobility
e = electron charge Solving these in the sphereical symmetric case leaves only the radial velocity, or $$u_\eta=u_g=0 \tag{13}$$

The continuity equation becomes $$\frac{1}{r^2}\frac{\partial}{\partial r}(r^2 n u_r) = 0 \qquad (14)$$

The Poisson equation reduces to $$\frac{\partial}{\partial r}\left(r^2\frac{\partial\phi}{\partial r}\right) = 4\pi e n r^2 \qquad (15)$$

The Lorentz equation is $$u_r = \mu\nabla_r\phi = \mu\frac{\partial\phi}{\partial r} \qquad (16)$$

Putting (16) into (14) results in $$\frac{\partial}{\partial r}\left(r^2 n\mu\frac{\partial\phi}{\partial r}\right) = 0 \qquad (17)$$

or $$\frac{\partial\phi}{\partial r} = \frac{c_1}{r^2 n\mu} \qquad (18)$$

where $c_1$ is a constant.

Together with (15), one can solve for the charge density $$n(r) = n_o\left[\frac{1}{1+\frac{8\pi e\mu n_o}{3c_1}(r^3 - r_o^3)}\right]^{\frac{1}{2}} \qquad (19)$$

where $n_o$ is the charge density at the surface of tip $r=r_o$. At $r=r_o$, the electric field is $E_o$; from (18), one gets $$n_o = \frac{-c_1}{\gamma_o^2\mu E_o} \qquad (20)$$

and at the outer surface $r=R$, the electric field is $E(R)$; then $$n(R) = \frac{-c}{R^2\mu\, E(R)} \qquad (21)$$

which from (19) is also equal to $$n(R) = n_o\left[\frac{1}{1+\frac{8en_o^2 R}{3c_1}}\right]$$

Equating (21) and (22), one can solve for $c_1$.

A numerical method to solve these equations may be used. With realistic values of the radius of tip (124) being 100 nm, the distance between tip (124) and nozzle mouth (126) being 1 mm, and the voltage between tip (124) and nozzle mouth (126) being 2 kV, the current density is found to be for the negatively charged case $3\times10^5$ amp/cm$^2$. The electron density at the center of nozzle mouth (126) is $4\times10^{15}$/cm$^3$, and decreases to $10^{14}$/cm$^3$ near the edge of nozzle mouth (126). FIGS. 3*a* through 3*k* illustrate this. In these graphs, as in this discussion, we have a=tip size b=the distance between tip and nozzle mouth mu=mobility $E_f$=fermion energy, a characteristic of the tungsten W=work function, a characteristic cf the tungsten $J_o$=electron current density $E_o$=electric field $n_0$=charge density r(m)=distance from tip to area measured (electric field, current density, potential, etc.)

Figure 3A:
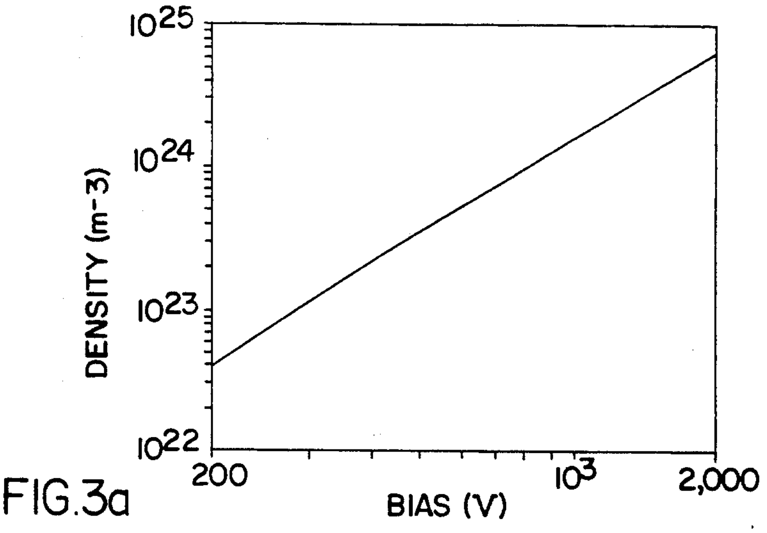
FIGS. 3*a* through 3*k* are graphs of a computer simulation showing the field emission effects in a device such as shown in FIG. 1.

FIG. 3*a* shows a charge density (1/m$^3$) at tip (124) as a function of the bias voltage (volts) between tip (124) and nozzle mouth (126). The maximum density can be as high as $(5\times10^{24})$/m$^3$.

Figure 3B:
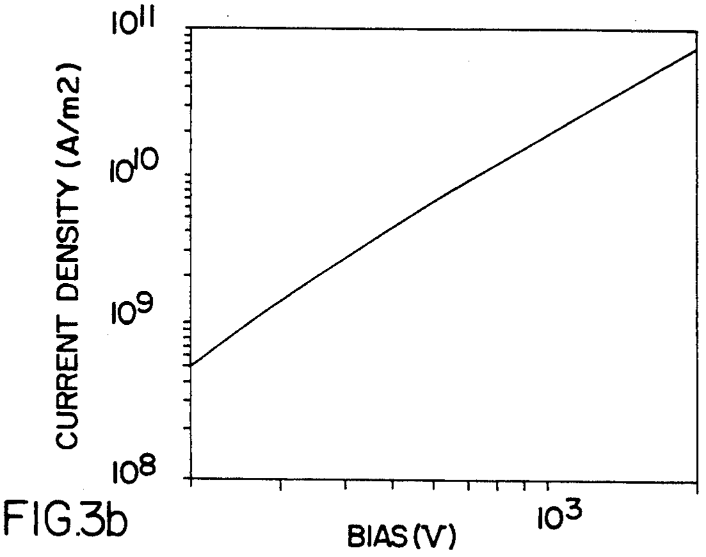

In FIG. 3*b*, the current density $J_o$ at tip (124) as a function of the bias voltage between tip (124) and nozzle mouth (126) is depicted. It is in the range of about $10^9$ to approximately $10^{11}$ amps/m$^2$.

Figure 3C:
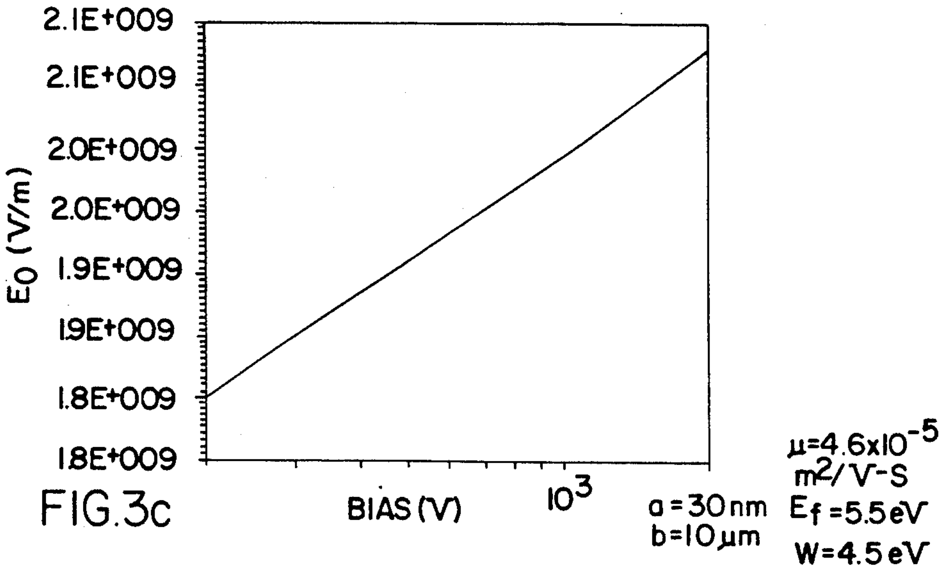
Figure 3D:
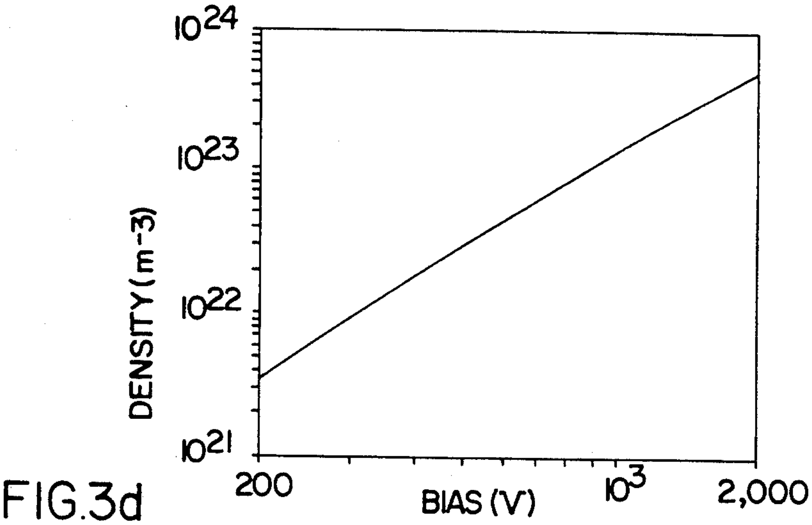
Figure 3E:
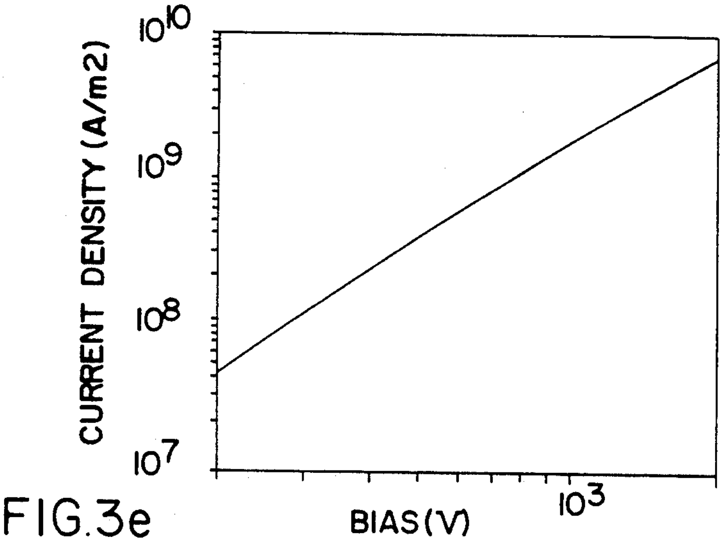
Figure 3F:
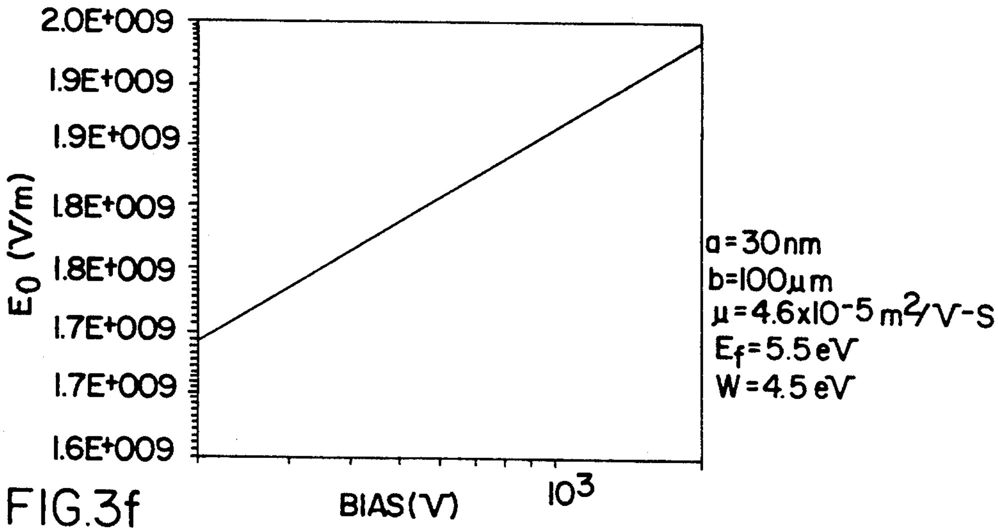

In FIG. 3*c*, the electric field at the surface of tip (124) as a function of the bias voltage is illustrated. It is basically $2\times10^9$ volts/m and is not sensitive to the bias voltage.

One can change the distance between tip (124) and nozzle mouth (126) to 100 micro meters and calculate the charge density, the current density, and the electric field as a function of the bias voltage. This has been done by the inventor and the results are found in FIGS. 3*d* through 3*f*.

Figure 3G:
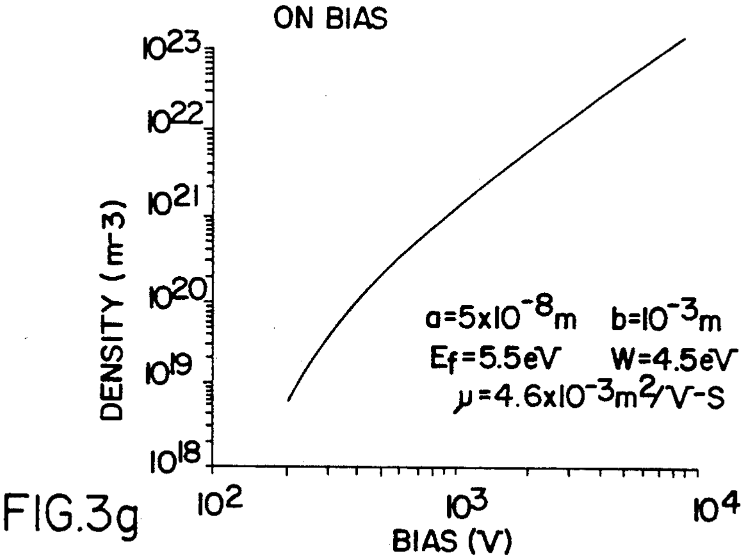
Figure 3H:
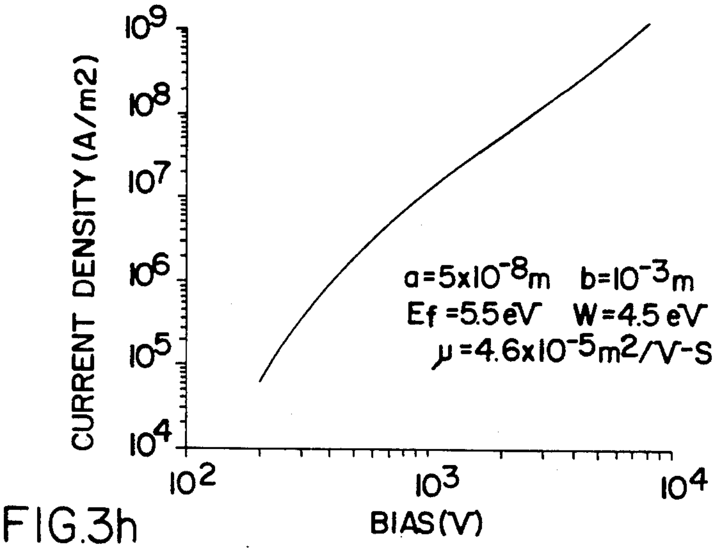
Figure 3I:
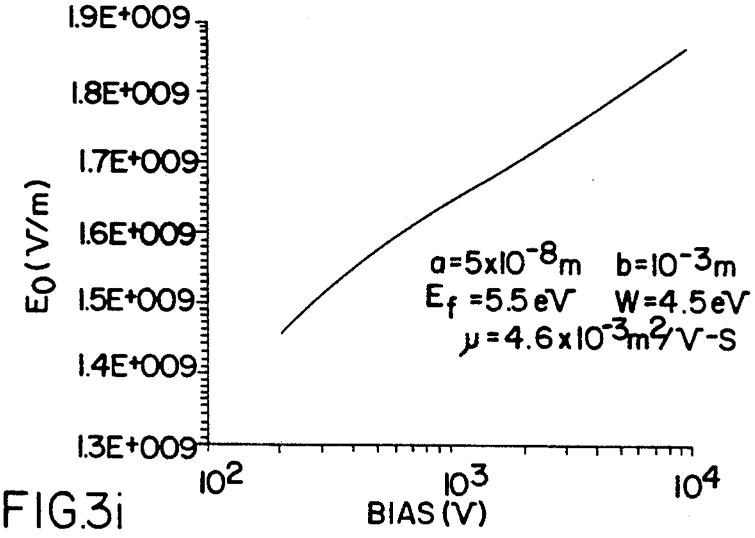
Figure 3J:
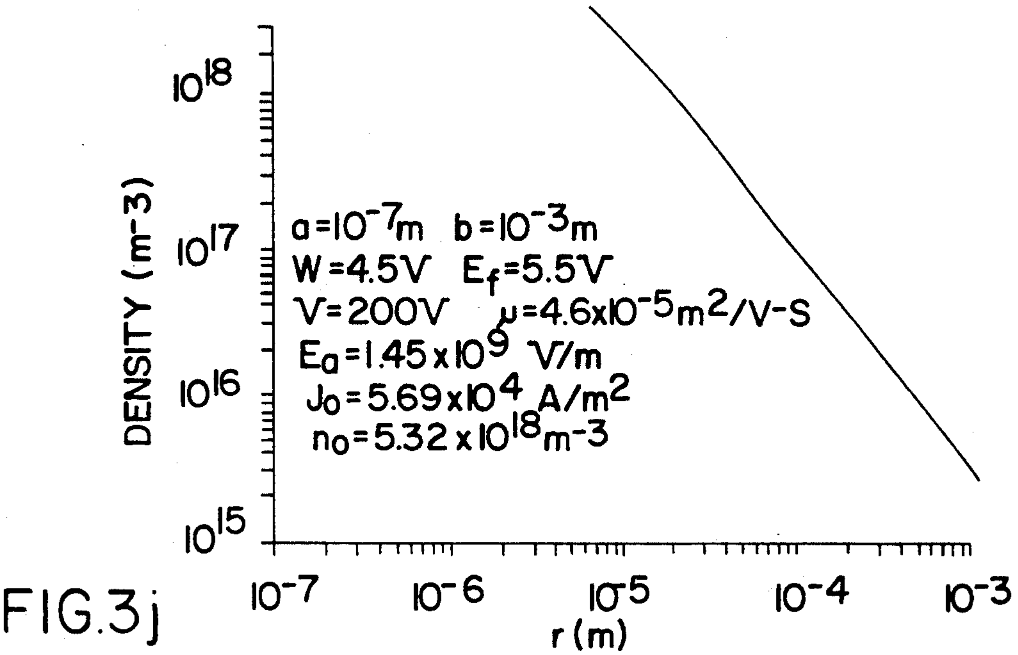
Figure 3K:
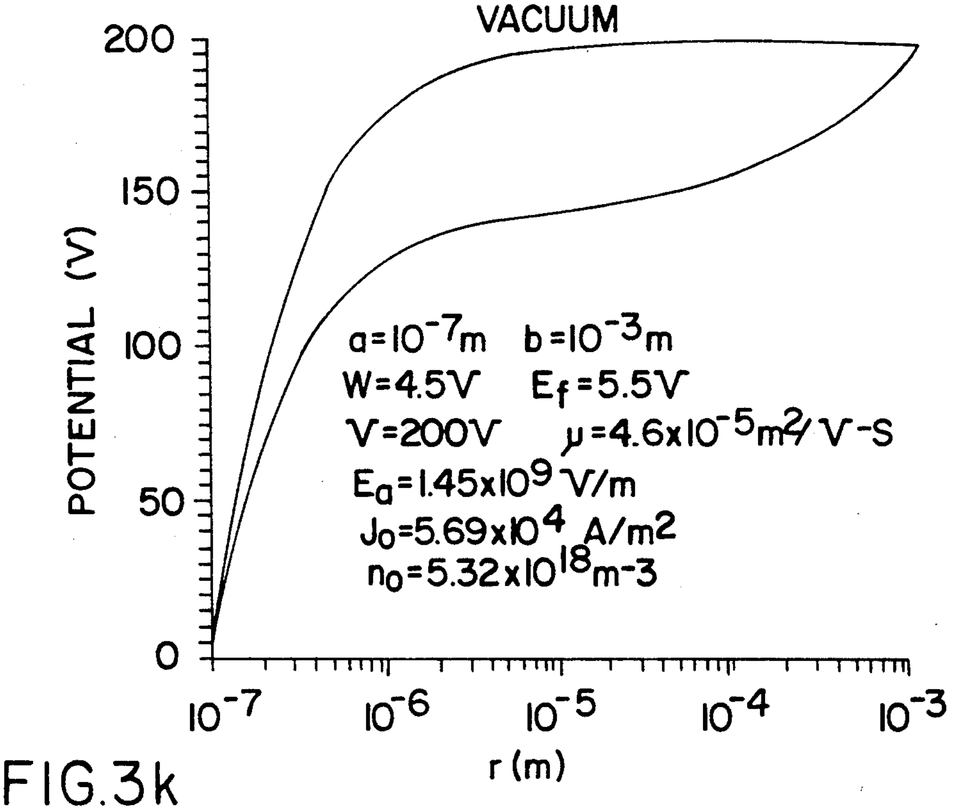

One can also change tip size (a) as well as alter the distance (b) between tip (124) and nozzle mouth (126) and see varied results. This again has been done by the inventor and is depicted in FIGS. 3*g* through 3*i*. These figures illustrate charge density, current density, and electric field at the surface of the tip (124) with the tip being 0.5 micron and the distance between the tip and nozzle mouth being 1 millimeter. In FIGS. 3*j* and 3*k* the tip size is increased to 100 nanometers while the distance between the tip and nozzle mouth is kept at 1 millimeter. The charge density and potential are shown as a function of the distance r from the surface of tip (124).

As the clusters are formed outside nozzle face (120) in the vacuum region, they are negatively charged by the excess electrons in them.

In order to enhance the current emitted, it may be advantageous to heat the tungsten wire (122) connected to tip (124) by passing electric current through it This generally vaporizes the liquid surrounding it to create a thin film of vapor around it. The vapor, however, serves as insulation to prevent the transmission of too much heat to the liquid. The power is of the order of 0.1 watts or less.

The electron density at the nozzle mouth is given by $$n_e = \frac{j}{ev_e} \qquad (23)$$

which is inversely proportional to the velocity of the electron $v_e$ desired so as not to disturb the clusters. As the current density (j) is conserved, the following equality results.

$$(j)_{before\ nozzle\ mouth} = (j)_{after\ nozle\ mouth} \qquad (24)$$

$$n_e'v_e' = n_e v_e$$

$n_e'$=electron density before nozzle expansion $v_e'$ = velocity of electron before nozzle expansion
$n_e$ = electron density after nozzle expansion
$v_e$ = velocity of electron after nozzle expansion So the density of excess electrons $n_e'$ in the clusters after nozzle expansion is increased by a factor of the ratio of $v_e'/v_e$, the velocity of electrons in the liquid before nozzle and after nozzle expansion. This factor can be as much as $10^3$.

In order to have a large $n_e$, it is better to discharge the electrons slowly near the nozzle mouth. The ratio of the electron density to the neutral density is $R_e$ where $$R_e = n_e/n_o \qquad (25)$$

$n_o$ = density of atoms in the liquid $\sim 2 \times 10^{22}/cm^3$(He).

The energy per atom $E_a$ in the cluster after expansion through nozzle is given by $$E_a = R_e e \Phi_o \qquad (26)$$

where $\Phi$ is the accelerated voltage after the clusters emerge from nozzle expansion. Listed in Table II are some numerical values for liquid helium.

TABLE II

Energy per Helium Atom in Helium Cluster after Acceleration by $\phi_o$ (volt)

| | | | | | | |
|---|---|---|---|---|---|---|
| $v_e$ cm/sec | | 1 | 10 | $10^2$ | $10^3$ | $10^4$ |
| $n_e/cm^3$ | | $6 \times 10^{10}$ | $6 \times 10^{19}$ | $6 \times 10^{18}$ | $6 \times 10^{17}$ | $6 \times 10^{16}$ |
| $R_e$ | | $3 \times 10^{-2}$ | $3 \times 10^{-3}$ | $3 \times 10^{-4}$ | $3 \times 10^{-5}$ | $3 \times 10^{-6}$ |
| $E_a$ (eV) | $e\phi_o$ = | | | | | |
| | 1 keV | 30 | 3 | 0.3 | 0.03 | .003 |
| | 10 keV | 300 | 30 | 3 | 0.3 | 0.03 |
| | $10^2$ keV | 3 keV | 300 | 30 | 3.0 | 0.3 |
| | 1 MeV | 30 keV | 3 keV | 300 | 30 | 3.0 |

where:

$v_e$ is the velocity of the excessive electrons after expansion
$n_e$ is electron density at nozzle mouth
$R_e$ is the ratio of electron density to neutral density
$E_a$ is energy per atom after expansion through nozzle mouth For a greater number of beams of charged particles, a plurality of nozzle mouths (126) with a plurality of centrally located tips (124) may be in one nozzle cell. These tips (124) would preferably be separated from each other but would all communicate with nozzle cell (112) for a common source of liquid. Since the size of tip (124) cannot be enlarged without diminishing the field emission effect, the way to increase current is to have many tips with many nozzle mouths (126) defined in one nozzle face (120).

Turning now to FIG. 4, a second embodiment of the invention is shown. In this graphic depiction, cryostat (100) and attachment means (110) have been omitted for the sake of simplicity. Instead, FIG. 4 focuses on tube (108) as it enters nozzle cell (112). In this embodiment, nozzle cell (112) again includes nozzle face (120) and nozzle mouth (126). Skimmers (128) are diagrammatically depicted in the area of lower pressure. The dimensions of nozzle mouth (126) are the same as that noted above, that is from about 5 microns to 1 millimeter. Absent from FIG. 4, is plug (114), adjustable mount (116) and tungsten wire (122) and its tip (124). These have been replaced by a photoelectric device now described.

Resting generally normally of, connected to, but insulated from nozzle mouth (126) is photocathode (140). This cathode is seen to extend inwardly from nozzle mouth (126) inside of nozzle cell (112). In communication with photocathode (140) is optical fibre (142) which passes outside of nozzle cell (112) to receive light waves transmitted through lens (144) by means of light source (146). In FIG. 4 a photoelectric effect is used to charge the liquid surrounding photocathode (140) prior to spraying this liquid into the lower pressure area where skimmers (128) are located. This means of charging the liquid is advantageous since it may be used at low temperature. This facilitates maintaining the liquid at a cold temperature, and since it generates a high number of emitted electrons, a high current results. Commercially available cathodes of this type have the following characteristics.

TABLE III

Cathode (Cs) $Na_2KSb$(S 20)

| Photo response | Wave length of Photons | Quantum efficiency |
|---|---|---|
| 45 mA/watt | 632.8 nm (Ne—Cd laser) | 9% |
| 100 mA/watt | 253 nm (mercury lamp) | 30% |

However, the Cs is easily damaged by impurities such as oxygen in the liquid. A more robust cathode will be a tungsten foil which has a work function $\phi$ = 4.5 eV, as compared with: $\phi$ = 2.14 eV for Cs. The light source shown in FIG. 4 may well be a laser source or a mercury lamp to generate ultraviolet light. This source may be pulsed or shown continuously on the cathode. A much stronger laser pulse would be needed if tungsten foil is used because the quantum efficiency for tungsten is many orders of magnitude smaller than for Cs. The intensity of the laser beam is determined by the foil material and the degree of strong coupling desired. It should be of the order of 100 watts or more.

The electrons emitted from the cathode generally have the kinetic energy T equal to the difference of photon energy h and the work function of the metal $\phi$ $$T = h\omega - \phi \qquad (27)$$

$\omega$ = frequency of the photon

So the kinetic energy of the electron is generally of the order 1eV, unless the photon energy is tuned just above the work function. If the photocathode (140) is immersed in the liquid, such as helium, and as shown in FIG. 4, then the electrons can be cooled off immediately to the temperature of the liquid. The kinetic energy of the electrons will be distributed throughout the liquid while only a small portion of the liquid will be squeezed off by pressure to nozzle. The electrons will be further attracted to nozzle mouth (126) by the external electric field applied by voltage (V). This is shown in FIG. 4. The maximum charge density at nozzle mouth (126) is $$n_{max}=I/(\pi d^2 v/4) \quad (28)$$

I=current from photoelectric effect d=diameter of nozzle mouth v=velocity of the cluster at nozzle mouth which is obtained by assuming that all of the electrons eventually will get out of the nozzle only through the nozzle mouth (126). The velocity v of the cluster at the nozzle mouth (126) depends on the pressure applied to the liquid, such as helium. If we take $v=10^3$ cm/sec, $d=5\mu m$, I=1 mA, the maximum possible electron density is $n_{max}=3.2\times10^{19}/cm^3$. This is quite a large number. At $T=10^{-4}$eV liquid helium temperature, the coupling $\Gamma$ is $7.5\times10^3$. Hence, we expect that when the clusters are formed outside the nozzle, they will be strongly coupled clusters. The photoelectric effect can only produce electrons, and cannot produce positively charged ions.

FIG. 5 is next to be viewed. Here, as in FIG. 4, the cryostat (100) and attachment means (110) have been deleted for the sake of simplicity. Tube (108) which initially was charged with a gas, preferably a purified gas, at the top of cryostat (100), is again shown in its connection with nozzle cell (112), at which point the gas has condensed into a liquid and empties into nozzle cell (112). Nozzle face (120) connects to nozzle cell (112) and defines as before, nozzle mouth (126). Nozzle mouth (126) has the same dimensions noted above. As in FIG. 4, absent from FIG. 5, is plug (114), adjustable mounting (116), tungsten wire (122) and tip (124). Instead, FIG. 5 uses an electron beam to charge the liquid in nozzle cell (112) which is now described. An ion beam may be used instead of an electron beam.

Opposite nozzle mouth (126) is tungsten foil (150) which forms a dividing wall of nozzle cell (112). Connected to nozzle cell (112) and tungsten foil or film (150) is vacuum tunnel (152). As can be seen in FIG. 5, vacuum tunnel (152) is isolated from nozzle cell (112) such that the pressure in nozzle cell (112) is not affected by the vacuum in vacuum tunnel (152). An electron gun (154) familiar to those skilled in the art, is connected to and communicates with vacuum tunnel (152). Electrons are fired from electron gun (154) in pulses or continously through vacuum tunnel (152) and against tungsten foil (150). The electrons are insulated by vacuum tube (152) from nozzle cell (112). The electrons are shot at film (150) as liquid is pumped through nozzle cell (112), out of nozzle mouth (126), and into the vacuum area where skimmers (126) are situated. Nozzle mouth (126) is again positively biased by known means. Connecting skimmers (128) to a voltage source is again also contemplated.

The energetic electron beam (which can be substituted by an ion beam of $He^+$ or $Ar^+$) is generated in the electron gun and injected into the liquid, such as helium, through the thin tungsten film (150). A tough thin metallic film, like tungsten film (150), is necessary to separate the vacuum tube (152) through which the electron/ion beam must travel to the liquid helium. The kinetic energy of the electron/ion beam must be high enough to penetrate the tungsten film (150). The electron range is given by $$R=AT[1-B/(1+CT)] \quad (29)$$

$A=0.55$ mg/(cm²keV)

$B=0.984$ $C=0.003$ keV$^{-1}$

T=kinetic energy of the electron in keV

Where a, A, B, and C are parameters as found in "Review of Particle Properties", Physic. Letters, Vol 170B, April 1986.

Numerically, they have the values

| | | | | |
|---|---|---|---|---|
| T: | 30 keV | 40 keV | 50 keV | 100 keV |
| R: | 1.6 mg/cm² | 2.67 mg/cm² | 3.97 mg/cm² | 13.37 mg/cm² |

For a tungsten foil of thickness $d=5\mu m$, density 4.5 gm/cm³, the range is 2.25 mg/cm². So an electron beam of 40 keV can then penetrate through a $5\mu m$ foil and still ionize the liquid helium to produce both electrons and $He^+$. Provided that an electric field is applied by voltage (V), the electron and positive ion $He^+$ produced from ionization will not recombine. For each highly energetic electron, we shall have more than one electron and ion at liquid helium temperature.

The foil (150) should be as close to nozzle mouth (126) as possible with the space therebetween being about 30 microns to 1 mm. The space between the foil (150) and the nozzle mouth (126) (the gap (g)) should be wide enough that the liquid which lies therebetween is able to stop the electrons emanating from the foil (150) so that the electrons do not pass out of the nozzle mouth (126) without stopping.

$$g>(R-R_w)/\rho \quad (30)$$

where $R_w$=decrease of range due to tungsten $\rho$=density of liquid helium

R=range of electrons

For the numerical example given above, g>30 micro meters. Then all of the electrons will be stopped between the nozzle mouth (126) and foil (150). The electrons and ions as they are emitted from the foil are also very close to nozzle mouth (126).

An external voltage of say 5 kV or more is maintained between nozzle mouth (126) and tungsten foil (150). If nozzle mouth (126) is maintained at a positive voltage with respect to tungsten foil (150), electrons will be attracted toward nozzle mouth (126). The clusters formed beyond nozzle mouth (126) during expansion will contain excessive electrons and will be negatively charged. If the polarity is reversed so that nozzle mouth (126) is negative with respect to foil (150), ions will be attracted to nozzle mouth (126). The clusters formed after expansion will be positively charged.

The same kind of effect can be obtained by replacing the electron beam with an ion beam. Generally, the electron beam should be at least 1 micro Amp to 1 milli Amp in intensity and it should be focused on the foil to a point of no less than 1 millimeter. The exact intensity of the beam depends upon the type of strongly coupled clusters desired. The stronger the beam, the stronger the coupling.

A last method of charging the liquid is depicted in FIG. 6. Here thermionic emission of electrons is used. A tungsten wire (122) is used to generate electrons in the liquid before the liquid passes through nozzle mouth (126). In this instance, the tungsten wire (122) of approximately 0.005" thickness is immersed in the liquid, such as liquid nitrogen. Electric current is then passed through the wire (122) and heat is thereby generated heating the wire (122). Due to the poor conductivity of the liquid nitrogen, the liquid around the wire (122) will be heated and a gas bubble will form around the wire. There will then be a temperature gradient between the gas bubble and the surrounding liquid nitrogen. Electrons will be emitted by the normal thermionic emission, and will be attracted by the positively biased potential maintained at nozzle mouth (126). Note that for this method, the setup shown in FIG. 1 is generally applicable, the tungsten tip (124) as well as adjustable mounting (116) being replaced by a simple non insulated tungsten wire (122). Thermionic emission is shown to work in superfluid helium to yield a total current of one microamp. The reader may wish to review Glen E. Spangler and F. L. Hereford: "Injection of electrons into HeII from an Immersed Tungsten Filament. Phys. Rev. Lett. V. 20 1229 (1968). The tungsten wire can also be substituted by a latham compound such as $LaB_6$ or other electrical element with a low work function.

Beams generated with charges as discussed herein have three distinct applications.

(1) Cutting Steel or Other Hard Objects. When liquid nitrogen is used in nozzle cells, it can be expanded into the ordinary atmospheric environment with some applied pressure. If the energy per nitrogen atom is above 0.1 eV, which is equivalent to one thousand degree $10^{3°}$ K, the nitrogen cluster can cut all kinds of objects: metal, steel, rock, human tissues, or even diamond. The power consumption is small. For a current of 1 mA and applied voltage $\phi_o = 10$kV, the power needed is 10 watts. This is to be compared with lasers, which consume kilowatts, or kW above, in power. Liquid nitrogen is readily available and very economical. Liquid nitrogen is also cold.

For many applications where high temperature beams such as those composed of flames, ions or plasma are to be avoided, this method is useful.

(2) For energy per atom $E_a$ above 6eV, which is equivalent to 2MB pressure when stopped, a liquid hydrogen cluster beam can be used to create metallic hydrogen. Six beams of liquid hydrogen can be shot together to a cube of solid hydrogen. The cube under extreme pressure from these six beams will form metallic hydrogen. The metallic hydrogen is superconducting at room temperature.

(3) For energy per atom $E_a$ above 100eV, and preferably 1 keV, deuterium cluster beams formed from liquid deuterium, or helium cluster beams formed from liquid helium can be used to create nuclear fusion. Six beams can be arranged to impact on a solid cube of deuterium.

Strongly coupled cluster beams, as described here, have advantages over laser implosion technique on inertia confinement fusion (ICF) because they do not preheat the deuterium target since there are no accelerated electrons as resulting from a laser-deuterium interaction. A deuterium-deuterium collision does not break loose electrons and create ionized plasma. The electrons are ionized only when whole deuterium under great pressure heats up together adiabatically.

Further, because of the extremely high intensity of the strongly coupled cluster beam, it can be used alone to assist the nuclear fusion process in magnetic confinement schemes such as in Tokamak.

If the liquid helium in the nozzle cell is superfluid helium, the helium clusters then consist of coherent helium and nuclear fusion can proceed via a coherent mechanism as well.

CONCLUSION

The inventor teaches the creation of clusters that are: strongly or weakly coupled, coherent, and neutral or charged. These clusters are formed from either a liquid or a gas that is a fluid. While throughout this description the term liquid is most often used when describing this invention, it is to be understood that the invention is equally applicable to gases. It is merely because the prior art does not disclose the formation of clusters from liquids, that the present disclosure has been written to draw the attention of the reader to the fact that this invention contemplates cluster formation from liquids as well as gases. Both gas and liquid may be generally referred to as fluids.

In the prior art known to the inventor, and in particular that disclosed by Friedman and in the Brookhaven experiments, the use of liquid for forming clusters is not disclosed and the forming of charged clusters prior to during their formation in a fashion that does not destroy the coupling or coherency of the clusters is not disclosed. The known art forms clusters from gases, super saturated gases, or superfluid helium and either charges the clusters significantly after formation or if it charges the clusters before formation, does so with electric arcing which disturbs the coupling of the clusters. To charge a fluid, that is a liquid or a gas, as taught by applicant, an element with a low work function is used to slowly emit the desired charge so that the coupling of the clusters is not disturbed.

Some of the fluids the inventor uses to form clusters, are water ($H_2O$), heavy water ($D_2O$), liquid nitrogen, liquid deuterium, liquid helium, liquid oxygen, and liquid hydrogen. The advantages of forming each of these liquids into clusters are enumerated below. The advantage of forming the clusters from a liquid rather than a gas is that the density of liquid (except liquid helium) is generally 800 to 10,000 times more than the density of the liquid in a gaseous state at boiling point. Thus clusters formed from a liquid as disclosed herein, are larger in both size and number. With such an increase, a much more intense cluster beam is created as the liquid formed clusters are sprayed out of the nozzle mouth. Cluster beams from said spraying have been measured in intensity of 0.1 eV per atom which is equivalent to tens of kilobars of pressure or one $10^4$ atmospheres of pressure. With the exception of liquid helium, the pressure in the nozzle cell need only be about 1 atmosphere or above. For liquid helium the pressure should be 10–100 atmospheres or above. The formation of helium clusters from superfluid helium is known in the art and not elaborated upon here.

a) Water

This is the cheapest and most easily obtainable commodity. When water clusters are accelerated to an energy per molecule of $E_a > 0.1$ eV. Accelerated in this fashion, the clusters can be used to cut metal or drill holes in rocks. Further, the pressure used outside of the nozzel mouth in the above examples does not have to be a vacuum, as long as the initial pressure on the water in nozzle cell is significantly above one atmosphere. The water can be at room temperature or below when passing it from the nozzle cell to the outside area of lower pressure. The water should preferably be pure so that it does not clog nozzle mouth (126).

b) Heavy Water

Replacing hydrogen by deuterium in water increases the cost enormously. But at sufficiently high energy, E>300 eV, these heavy water clusters can ignite fusion as the Brookhaven group has shown. Again, as above, the heavy water may be at room temperature or below and the pressure outside nozzle mouth in the area of skimmers need not be vacuum pressure.

c) Liquid Nitrogen

Liquid nitrogen is very cold when compared with water. In industrial situations where cold treatments are preferable, liquid nitrogen can be substituted for water. Liquid nitrogen is still relatively inexpensive, and can be handled cryogenically rather easily. Vacuum pressure is required outside of the nozzle mouth to keep the nitrogen cool.

d) Liquid Hydrogen

Energetic hydrogen clusters ($E_a$>20 eV, or pressure >2MB [megabar]) formed from liquid hydrogen can be used to create superconducting metallic hydrogen. Vacuum pressure is required outside of the nozzle mouth.

e) Liquid Deuterium

Liquid deuterium is far purer than heavy water as it contains only deuterium atoms. In some applications, pure deuterium clusters formed from liquid deuterium may be preferable to ignite nuclear fusion. Vacuum pressure is required outside of the nozzle mouth.

f) Liquid Helium

Coherent helium cluster can be obtained from liquid helium in the source nozzle cell and hence are very valuable as research tools as well as for industrial application. Vaccuum pressure is required outside of the nozzle mouth.

Charged cluster beams formed as disclosed herein may be accelerated by an external electric field. This field will not destroy the strong coupling of the clusters. The result will be an extremely intense, energetic, strongly coupled cluster beam having a low energy spread.

I claim:

1. A method for forming strongly coupled charged clusters comprising:

passing a fluid into a nozzle defining a nozzle mouth, said nozzle maintaining the fluid at a first pressure;

introducing one of negatively or positively charged particles in the fluid through the respective one of field emission or ionization, said introducing being done so as not to destroy the strong coupling of said clusters;

directing the charged fluid out of said nozzle mouth into a second area of lesser pressure that the first area, whereby charged clusters are created.

2. The method of claim 1 wherein said introducing one of negatively or positively charged particles is accomplished by means of an electrical element with a low work function.

3. The method of claim 1, wherein the introducing one of negatively or positively particles occurs very close to said nozzle mouth.

4. A method for forming coherent charged clusters comprising:

passing a liquid into a nozzle defining a nozzle mouth, said nozzle maintaining the liquid at a first pressure;

introducing one of negatively or positively charged particles in the liquid through the respective one of field emission or ionization, said introducing step being such that said coherency is not destroyed;

directing the charged liquid out of said nozzle mouth into a second area of lesser pressure than the first area such that charged coherent clusters are created.

5. A method of forming clusters from a liquid comprising:

passing said liquid from an area of first pressure to an area of second pressure, said area of second pressure being of a lower pressure than said area of first pressure;

charging said liquid prior to its exit from said area of first pressure to said area of second pressure, said charging being done so as not to destroy the coherency of said liquid as it forms into clusters while it passes from said area of first pressure to said area of second pressure.

6. The method of claim 5, wherein said area of first pressure is at least one atmosphere in pressure.

7. The method of claim 5, wherein said area of second pressure is a vacuum.

8. The method of claim 5, wherein said area of second pressure is a vacuum.

9. The method of forming clusters from a gas comprising: passing said gas from an area of first pressure to an area of second pressure, said area of second pressure being of a lower pressure than said area of first pressure;

charging said gas prior to its exit from said area of first pressure to said area of second pressure, said charging being done so as not to destroy the coherency of said gas as it forms into clusters while it passes from said area of first pressure to said area of second pressure.

* * * * *